United States Patent
Sauer et al.

(10) Patent No.: US 8,998,016 B2
(45) Date of Patent: Apr. 7, 2015

(54) FORCING-OFF DEVICE AND CONTAINER INCLUDING SUCH A DEVICE

(75) Inventors: Dieter Sauer, Heddesbach (DE); Frank Hieronymus, Hesseneck-Schollenbach (DE); Gerhard Schwarz, Schonbrunn (DE)

(73) Assignee: Cooper Crouse-Hinds GmbH, Soest (DE)

( * ) Notice: Subject to any disclaimer, the term of this patent is extended or adjusted under 35 U.S.C. 154(b) by 0 days.

(21) Appl. No.: 13/812,905

(22) PCT Filed: Jun. 16, 2011

(86) PCT No.: PCT/EP2011/002980
§ 371 (c)(1),
(2), (4) Date: Apr. 10, 2013

(87) PCT Pub. No.: WO2012/013267
PCT Pub. Date: Feb. 2, 2012

(65) Prior Publication Data
US 2013/0206769 A1    Aug. 15, 2013

(30) Foreign Application Priority Data
Jul. 30, 2010 (DE) .......................... 10 2010 032 832

(51) Int. Cl.
*B65D 51/00* (2006.01)
*H05K 5/02* (2006.01)

(52) U.S. Cl.
CPC . *B65D 51/00* (2013.01); *H05K 5/02* (2013.01)

(58) Field of Classification Search
CPC .............. B65D 2543/00888; B65D 2251/1075; B65D 51/00; B65D 2519/0086; H02G 3/086; H02G 3/14; H05K 5/0013; H05K 5/0004
USPC .......... 220/285, 284, 260, 560.01, 4.02, 3.94, 220/3.8, 3.7, 200; 361/679.58, 679.02, 361/679.01; 174/562, 561, 560, 559, 520, 174/50.5
See application file for complete search history.

(56) References Cited

U.S. PATENT DOCUMENTS
2004/0117946 A1   6/2004   Lin et al.

FOREIGN PATENT DOCUMENTS
CH            173230 A     11/1934
DE     102005047713 B4     4/2007
(Continued)

OTHER PUBLICATIONS

English translation of Office Action for German Application No. 10 2010 032 832.4-27, mailed Mar. 25, 2011.
(Continued)

*Primary Examiner* — Robert J Hicks
(74) *Attorney, Agent, or Firm* — Fish & Richardson P.C.

(57) ABSTRACT

A forcing-off device of an, in particular, explosion-proof or flameproof container for electronic devices, the container including at least one base body having an opening surrounded by an opening edge and a cover part that can be placed onto or inserted into the opening edge. A forcing-off shoulder is formed on the base body or cover part at least in a section in circumferential direction of the container. The forcing-off shoulder is part of a shoulder running around the opening edge, and at least one forcing-off part is rotatably mounted in a lateral recess of the cover part or on the base body in an eccentric fashion between a forcing-off position and a passive position. The forcing-off part is an eccentric disc and in the forcing-off position is in abutment with the forcing-off shoulder for the gap-forming spacing of cover part and base body.

11 Claims, 3 Drawing Sheets

(56) References Cited

FOREIGN PATENT DOCUMENTS

| | | | |
|---|---|---|---|
| DE | 202009010039 U1 | 11/2009 | |
| EP | 48682 A3 | 3/1982 | |
| GB | 544292 A | 4/1942 | |
| GB | 2460226 A | 11/2009 | |

OTHER PUBLICATIONS

Authorized officer Andreas Kaluza, International Search Report/Written Opinion in PCT/EP2011/002980, mailed Nov. 18, 2011, 2 pages.

German Examination Report, dated Mar. 25, 2011, 3 pages.

FORCING-OFF DEVICE AND CONTAINER INCLUDING SUCH A DEVICE

CROSS-REFERENCE TO RELATED APPLICATIONS

This application is a U.S. National Stage application under 35 U.S.C. §371 of International Application Number PCT/EP2011/002980, filed Jun. 16, 2011, which claims priority from German Application No. 10 2010 032 832.4, filed Jul. 30, 2010.

TECHNICAL FIELD

The present invention refers to a forcing-off device of an, in particular, explosion-proof or flameproof container.

BACKGROUND

An explosion-proof or flameproof container includes at least one base body having an opening surrounded by an opening edge and a cover part that can be placed onto or inserted into the opening edge. Such containers serve, for instance, to receive electronic devices and may be arranged as individual containers or also in groups. The cover part and the base body are for instance screwed to one another to firmly fasten the cover part to the base body. The contact surfaces formed between the cover part and the base body especially in the area of the opening edge have a flat design as a rule and are protected by application of a protecting agent, such as a lubricant, e.g. against corrosion. If one wants to open the container after some time, this may be relatively difficult because of the adhesion between the base body and the cover part. The protecting agent can almost have the effect of an adhesive.

As a rule, the attempt is made to form a gap between cover part and base body by using a tool, the gap being then used for the further opening of the container. When a corresponding force is applied, the cover part or the base body may get damaged particularly in the area of the opening edge, so that when the container is closed again, it is no longer possible to guarantee explosion protection or flame proofness. This might lead to increased costs, to the repair of the container or to an unsafe container.

It is known from practice that tools are, for example, used for forming the corresponding gap, the tools being made of a softer material than the material of the container. Although damage during formation of the gap can thereby mainly be avoided, it is still rather difficult to open the container.

SUMMARY

It is therefore an object of the present disclosure to provide a forcing-off device of a corresponding container in the case of which the container can be opened in a simple manner without damage.

This object is achieved by the features of claim 1.

The invention is particularly characterized in that a forcing-off shoulder is formed on the base body or on the cover part at least in a section in the circumferential direction of the container and at least one forcing-off part is mounted on the cover part or on the base body in rotatable fashion between a forcing-off position and a passive position. In the forcing-off position the forcing-off part is in abutment with the forcing-off shoulder for the gap-forming spacing of cover part and base body.

According to the invention it is possible that the forcing-off part is e.g. arranged on the cover part, with the corresponding forcing-off shoulder being then formed on the base body. By analogy, the inverse or also a combined arrangement is applicable, so that it is also possible to provide a forcing-off part on the cover part and a further forcing-off part on the base body with respectively associated forcing-off shoulders on the respectively other part of the container. It is also possible to provide two or more forcing-off parts on the cover part or on the base body with the respectively associated forcing-off shoulders on the other part of the container.

According to the invention the forcing-off part is rotated out of its passive position, in which it is not in abutment with the forcing-off shoulder, into its forcing-off position. During this rotation the forcing-off part gets into contact with the forcing-off shoulder and upon rotation up into the forcing-off position the forcing-off part is forced off on the forcing-off shoulder so that a gap-forming spacing of the cover part and the base body is thereby accomplished. The corresponding spacing between the cover part and the base body is then at least so great that the cover part and the base body can subsequently be separated relatively easily by manual action on the cover part or by use of further tools. At least the initial adhesion, see the above description, is overcome by the gap-forming spacing because the cover part and the base body are separated from each other at least by a gap.

Depending on the requirements, the spacing can be predetermined by way of a corresponding configuration of forcing-off part and forcing-off shoulder.

The corresponding forcing-off shoulder may be part of a shoulder extending on the whole in circumferential direction. For instance, the opening edge may comprise such a surrounding shoulder. It is also possible that such a surrounding shoulder is formed with the forcing-off shoulder on the base body.

It is conceivable that the forcing-off shoulder protrudes from the respective part of the container over corresponding side surfaces to the outside. In this context also the forcing-off part may be rotatably mounted in outwardly protruding fashion on the respectively other part of the container. An embodiment may be preferred in which the forcing-off part is rotatably mounted in a lateral recess of the base body or the cover part. The forcing-off part does thereby not laterally protrude from the corresponding part of the container so that it is arranged in a relatively protected way. By analogy, the corresponding forcing-off shoulder may also be configured in the area of this lateral recess for the arrangement of the forcing-off part and particularly only protrude outwards in the area of the lateral recess.

To be able to establish a contact between the forcing-off part and the forcing-off shoulder in a simple manner, the lateral recess may be opened at least in the direction of the forcing-off shoulder. The forcing-off part can protrude through the opening by correspondingly rotating the part and can then establish the gap-forming spacing in its forcing-off position by corresponding contact with the forcing-off shoulder.

A tool, such as a screwdriver or the like, is normally used for rotating the forcing-off part. To bring the tool into contact with the forcing-off part in an easy manner, the lateral recess may comprise an engagement depression which is open towards an edge of cover part or base body. The corresponding tool can be brought into contact and engagement with the forcing-off part through this engagement depression, so that the forcing-off part is then rotatable by the tool between passive position and forcing-off position.

The corresponding engagement depression is here at least so great in rotation direction that an adequate rotation of the forcing-off part between passive position and forcing-off position is possible by the corresponding tool.

The forcing-off part may be configured in different ways. A lever-like forcing-off part is feasible, of which one lever arm can be brought into engagement with the corresponding tool whereas the other lever arm can be brought into contact with the forcing-off shoulder by correspondingly rotating the forcing-off part.

In an embodiment the forcing-off part may be an eccentric disc.

To permit an engagement between corresponding tool and forcing-off part in a simple way, the forcing-off part may include an engagement opening oriented substantially towards engagement recess. The tool can be inserted in part into the engagement opening from the engagement recess, and the forcing-off part can then be rotated by the tool between the corresponding positions.

Depending on the tool used, the engagement opening may be configured accordingly. If for example a screwdriver is used, the engagement opening may be configured to be slit-shaped.

To define the passive position and also to simplify insertion of the corresponding tool, the engagement opening may include a guide projection protruding in the direction of engagement recess. The projection protrudes at one side from the engagement opening and can be used as a guide stop.

Moreover, in the passive position the corresponding guide projection may be in abutment with a boundary edge of the engagement opening, whereby the passive position is fixed.

Advantageously, a corresponding forcing-off part is arranged near an edge of the container to as to separate cover part and base body in the area. A corresponding forcing-off part may be arranged at least at each side of the container in the area of such an edge.

To prevent the forcing-off part from protruding to the outside, the forcing-off part may be arranged in especially countersunk fashion in a laterally surrounding cover edge of the cover part. This applies by analogy to an arrangement of the forcing-off part in the base body.

The invention also refers to a corresponding container with at least one forcing-off device, as has been described above.

Advantageous embodiments of the invention shall now be explained in more detail with reference to the figures attached in the drawing, of which

DETAILED DESCRIPTION

Figure 1:
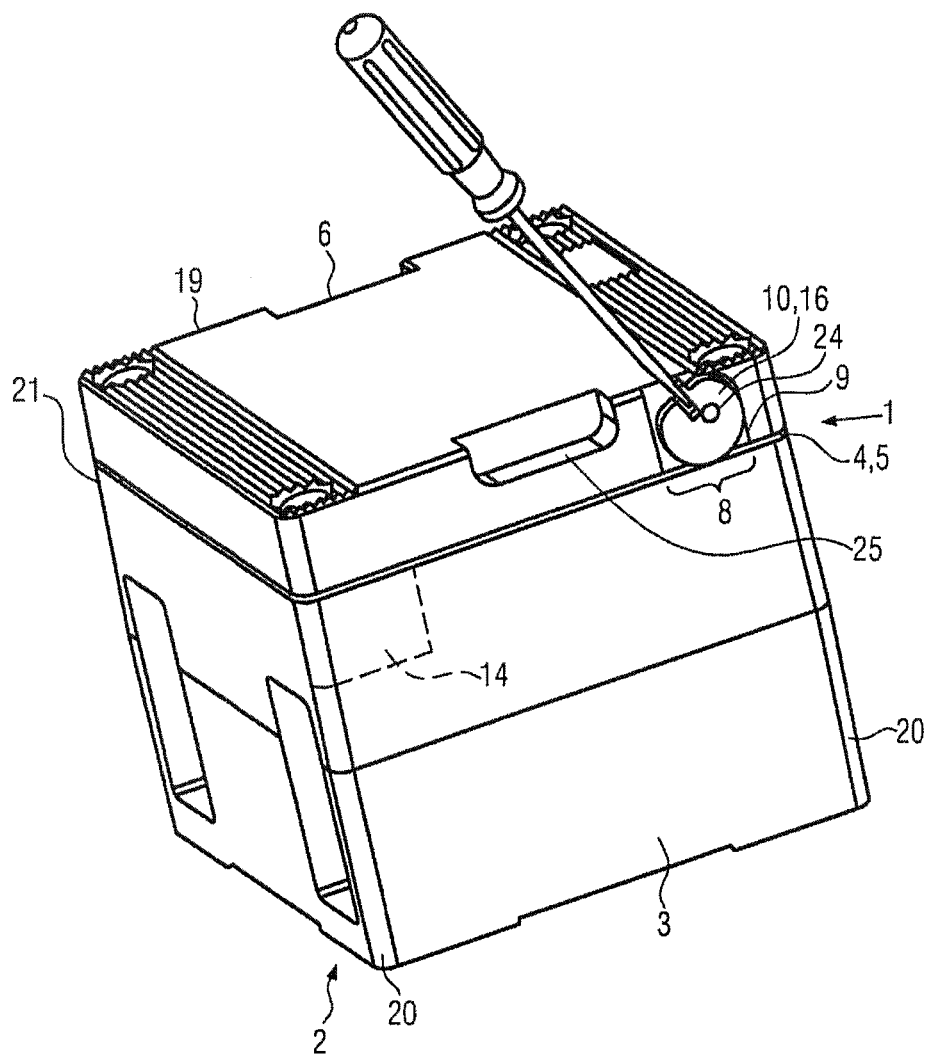
FIG. 1 is a perspective view of a container with an embodiment of a forcing-off device according to the invention.

FIG. 1 shows a perspective side view of a forcing-off device 1 of a container 2. The container 2 includes an approximately cube-shaped base body 3. At the upper end thereof the base body 3 includes an opening 5 which is surrounded by an opening edge 4. A cover part 6 is detachably mounted on the opening 5 and the opening edge 4, respectively. The cover part 6 includes two recessed grips 25 and a cover edge 21 protruding in the direction of base body 3.

Depending on the embodiment, the opening edge 4 of the base body 3 is gripped over by the cover edge 21 of the cover part 6, see FIG. 1 in this respect, or, however, the cover edge 21 is inserted into the opening edge 4. The correspondingly inwardly positioned opening or cover edge includes an outwardly protruding shoulder 13, see also FIG. 3, which serves as a flat abutment surface for the edge of the correspondingly other part. A seal or corrosion-protector, such as e.g. a lubricant, is usually applied between the edges. Due to the narrow and flat abutment of the corresponding edges and due to the explosion-proof and flameproof configuration of the container, problems may arise in some cases during detachment of the cover part 6.

To easily lift off the cover part 6 from the base body 3 at least to some extent, the container 2 includes the forcing-off device 1.

The device is arranged in the illustrated embodiment in the area of an edge of the container 2 in the cover edge 21. The forcing-off device 1 includes a rotatable forcing-off part 10 in the form of an eccentric disc 16. The disc is eccentrically supported in rotatable fashion on a rotation shaft 24. The eccentric disc 16 is arranged in a recess 14 of the cover edge 21. As a consequence, the eccentric disc 16 is arranged countersunk in the recess 14 and does not protrude outwards beyond the cover edge. The recess 14 includes an engagement depression 15 on its upper side. A tool 23, see also FIG. 3, such as for instance a screwdriver, is insertable via the depression into the recess 14. For the rotational connection of the tool with the forcing-off part 10, said the part includes an engagement opening 17 which is oriented towards engagement recess 15. The engagement opening 17 is configured to be slit-shaped for insertion of a free end of the tool 23. At least at one side, the slit-shaped engagement opening 17 includes a guide projection 18 protruding in the direction of tool 23. The projection serves both the lateral abutment on the tool 23 and the fixation of a passive position 12 of the forcing-off part 10, see FIG. 3. In this passive position, the guide projection 18 rests on an edge of the engagement depression 15.

Figure 3:
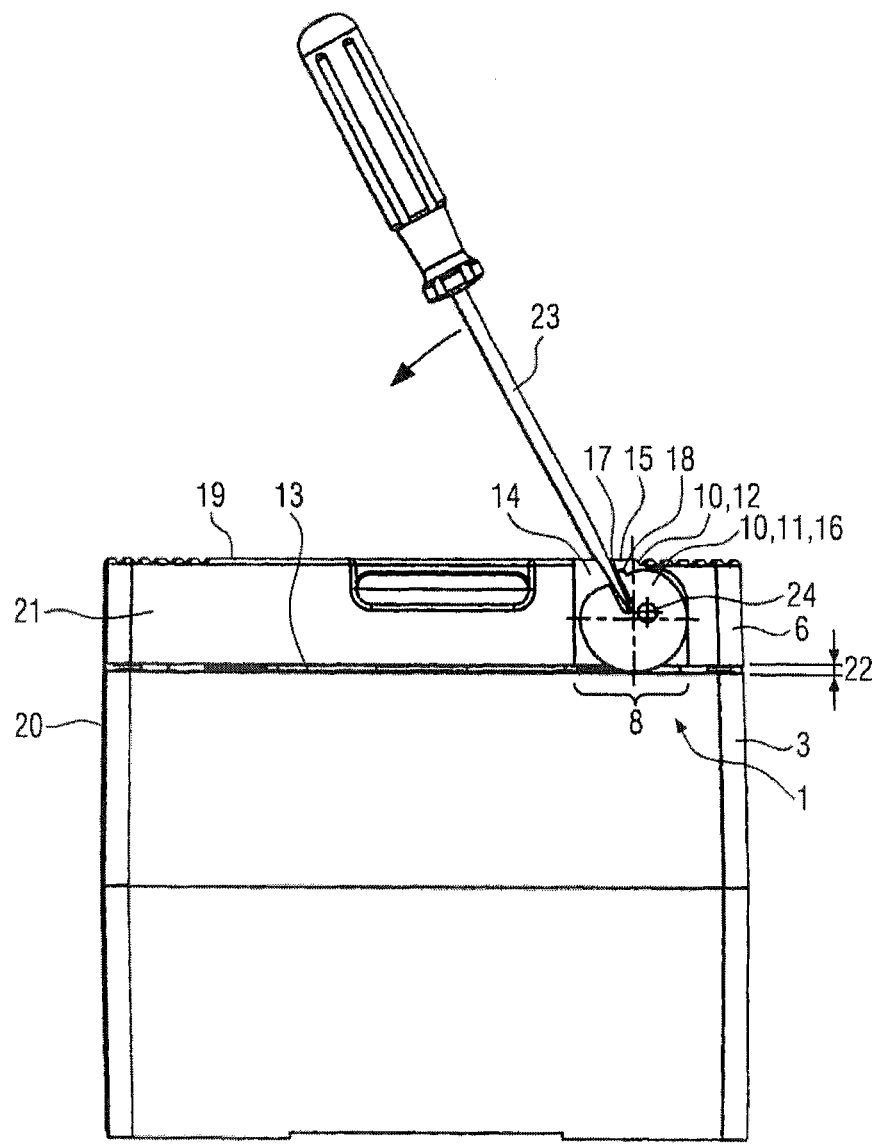
FIG. 3 is a side view of the container according to FIG. 1 with forcing-off device at that side.

In FIGS. 1 and 3 the forcing-off part 10 is pivoted into its forcing-off position 11. The forcing-off part 10 is thereby in contact with a forcing-off shoulder 9 which is part of the shoulder 13. In this forcing-off position 11 a gap 22 is formed between the lower end of the cover part 6 and the shoulder 13 of the base body 3. An already partial separation of cover part 6 and base body 3 that overcomes a first adhesion of the two parts to each other and facilitates a subsequent pulling off of the cover part 6 is carried out through the gap.

The corresponding forcing-off shoulder 9 is formed in a section 8 of the shoulder 13. In this section 8 the recess 14 is open towards the forcing-off shoulder 9. With a corresponding rotation of the forcing-off part 10 the part can thus protrude from the recess 14 in the direction of forcing-off shoulder 9 and can form the gap 22 between cover part 6 and base body 3 upon a corresponding rotation up into the forcing-off position 11

FIG. 1 shows in broken line a further recess 14 which is arranged in the area of an edge 20 of the base body 3. There is the possibility that a corresponding forcing-off part 10 is rotatably mounted in such a recess 14 and presses against a corresponding forcing-off shoulder 9 on cover part 6 upon rotation from passive position 12 into forcing-off position 11 and thereby forms a corresponding gap 22.

Figure 2:
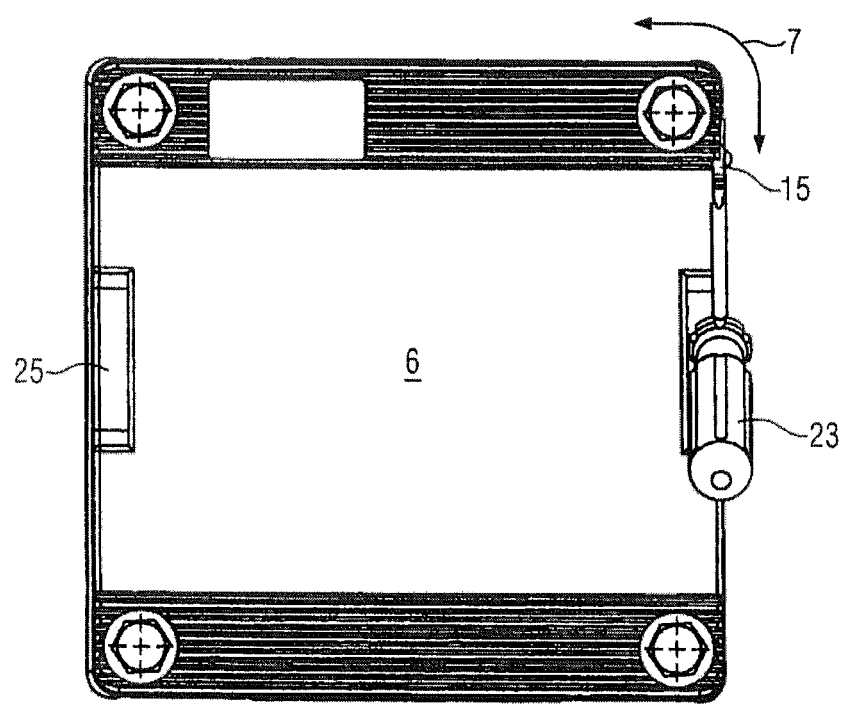
FIG. 2 is a top view on the container according to FIG. 1.

There is further the possibility that a plurality of such forcing-off devices 1 are arranged e.g. along a circumferential direction 7, see also FIG. 2, of the container preferably in the area of edges 19 and 20, respectively. From the respective edge the engagement of the corresponding tool 23 takes place, see also FIGS. 1 and 3.

FIG. 2 shows the container 2 according to FIG. 1 in a top view. The tool 23 can particularly be seen in an inclined position in which the forcing-off part 10 is rotated into the forcing-off position 11. Otherwise, reference is made to FIGS. 1 and 3 with respect to the description of the forcing-off device and of the container.

FIG. 3 is a side view showing the container 2 with the forcing-off device 1 arranged in the area of the cover edge 21. The forcing-off device 1 is illustrated by analogy with FIG. 1, the forcing-off part 10 being already arranged in a corresponding forcing-off position 11. In a substantially vertical position of the tool 23 according to FIG. 3, the forcing-off part 10 is arranged in its passive position 12; see also the dashed representation in FIG. 3.

In such a passive position 12 the guide projection 18 laterally abuts on an edge of the engagement recess 15. In passive position 12, cover part 6 and base body 3 are in engagement with one another without formation of a gap.

In FIG. 3, the shoulder 13 extending in circumferential direction, see also FIG. 2, can particularly be seen, with the corresponding forcing-off shoulder 9 being a part thereof.

Reference is also made to the preceding description.

The invention also refers to a corresponding container 2 with at least one forcing-off device 1, as has been described in the preceding text.

Such a container 2 can be used as an individual container or also as an integrated container of an electrical appliance or in the course of an electrical distribution.

With the invention it is possible to separate at least in part a corresponding cover part from the base body in a simple way without the need for directly forming a gap between the cover part and the base body with a tool.

The invention claimed is:

1. A forcing-off device of an explosion-proof or flameproof container for electronic devices, the container comprising at least one base body having an opening surrounded by an opening edge and a cover part that can be placed onto or inserted into the opening edge,
wherein a forcing-off shoulder is formed on, at least one of, the base body or the cover part, at least in a section in a circumferential direction of the container,
wherein the forcing-off shoulder is part of a shoulder running around the opening edge, and at least one forcing-off part is rotatably mounted in a lateral recess of the cover part or on the base body, in an eccentric fashion between a forcing-off position and a passive position,
the at least one forcing-off part including an eccentric disc and in the forcing-off position is in abutment with the forcing-off shoulder for a gap-forming spacing of the cover part and the base body.

2. The forcing-off device of an explosion-proof or flameproof container according to claim 1, wherein the lateral recess is opened at least in the direction of the forcing-off shoulder.

3. The forcing-off device of an explosion-proof or flameproof container according to claim 1, wherein the lateral recess has an engagement depression which is open towards an edge of the cover part or the base body.

4. The forcing-off device of an explosion-proof or flameproof container according to claim 3, wherein the forcing-off part has an engagement opening oriented substantially in the direction of the engagement depression.

5. The forcing-off device of an explosion-proof or flameproof container according to claim 4, wherein the engagement opening is slit-shaped.

6. The forcing-off device of an explosion-proof or flameproof container according to claim 4, wherein the engagement opening is configured as a blind hole.

7. The forcing-off device of an explosion-proof or flameproof container according to claim 4, wherein the engagement opening comprises a guide projection protruding in the direction of the engagement depression.

8. The forcing-off device of an explosion-proof or flameproof container according to claim 1, wherein the forcing-off part is arranged, countersunk, in a laterally surrounding cover edge of the cover part.

9. The forcing-off device of an explosion-proof or flameproof container according to claim 1, wherein the eccentric disc is rotatably mounted, in the lateral recess of the cover part or on the base body, in an eccentric fashion.

10. The forcing-off device of an explosion-proof or flameproof container according to claim 1, wherein in the forcing-off position an outer edge of the eccentric disc is in abutment with the forcing-off shoulder for the gap-forming spacing of the cover part and the base body.

11. The forcing-off device of an explosion-proof or flameproof container according to claim 1, wherein in the passive position, the eccentric disc is not in abutment with the forcing-off shoulder.

* * * * *